United States Patent [19]

Araki

[11] Patent Number: 5,587,653
[45] Date of Patent: Dec. 24, 1996

[54] SENSOR CHARACTERISTIC ADJUSTMENT CIRCUIT FOR ADJUSTING OUTPUT CHARACTERISTICS OF A SEMICONDUCTOR SENSOR

[75] Inventor: Tohru Araki, Itami, Japan

[73] Assignee: Mitsubishi Denki Kabushiki Kaisha, Tokyo, Japan

[21] Appl. No.: 172,192

[22] Filed: Dec. 23, 1993

[30] Foreign Application Priority Data

Dec. 28, 1992 [JP] Japan .................................. 4-349167

[51] Int. Cl.⁶ ............................................. G01R 15/00
[52] U.S. Cl. ............................................................ 324/132
[58] Field of Search .................... 340/870.04, 870.37, 340/870.21; 324/132; 364/573, 413.06

[56] References Cited

U.S. PATENT DOCUMENTS 4,783,659  11/1988  Frick ........................................ 364/573
5,051,743   9/1991  Orszolak ............................. 340/870.37
5,137,205   8/1992  Inohara et al. ......................... 228/180.2

OTHER PUBLICATIONS

Brignell et al, "Sensors for Microprocessor-Based Applications", J. Phys. E: Sci. Instrum., vol. 16, 1983, pp. 952–958, 1983 (month unavailable).

*Primary Examiner*—Ernest F. Karlsen
*Assistant Examiner*—Russell M. Kobert
*Attorney, Agent, or Firm*—Leydig, Voit & Mayer

[57] ABSTRACT

A sensor characteristic adjustment circuit for adjusting the offset and the sensitivity of an output of a semiconductor sensor includes a serial-parallel converter for converting serial data bits into corresponding parallel data bits, a non-volatile memory for storing the parallel data bits, and digital-to-analog converters for converting the digital bits $D_1$ through $D_m$ and $D_{m+1}$ through $D_n$ into values corresponding to the offset and the sensitivity supplied to an adder and a voltage-controlled amplifier, respectively. Preferably, gates are inserted between the serial-parallel converter and the non-volatile memory to separate the non-volatile memory from the serial-parallel converter after the parallel data is written into the non-volatile memory.

13 Claims, 8 Drawing Sheets

SENSOR CHARACTERISTIC ADJUSTMENT CIRCUIT FOR ADJUSTING OUTPUT CHARACTERISTICS OF A SEMICONDUCTOR SENSOR

BACKGROUND OF THE INVENTION

This invention relates to sensor characteristic adjustment circuits for adjusting the characteristics of a semiconductor sensor.

Figure 9:
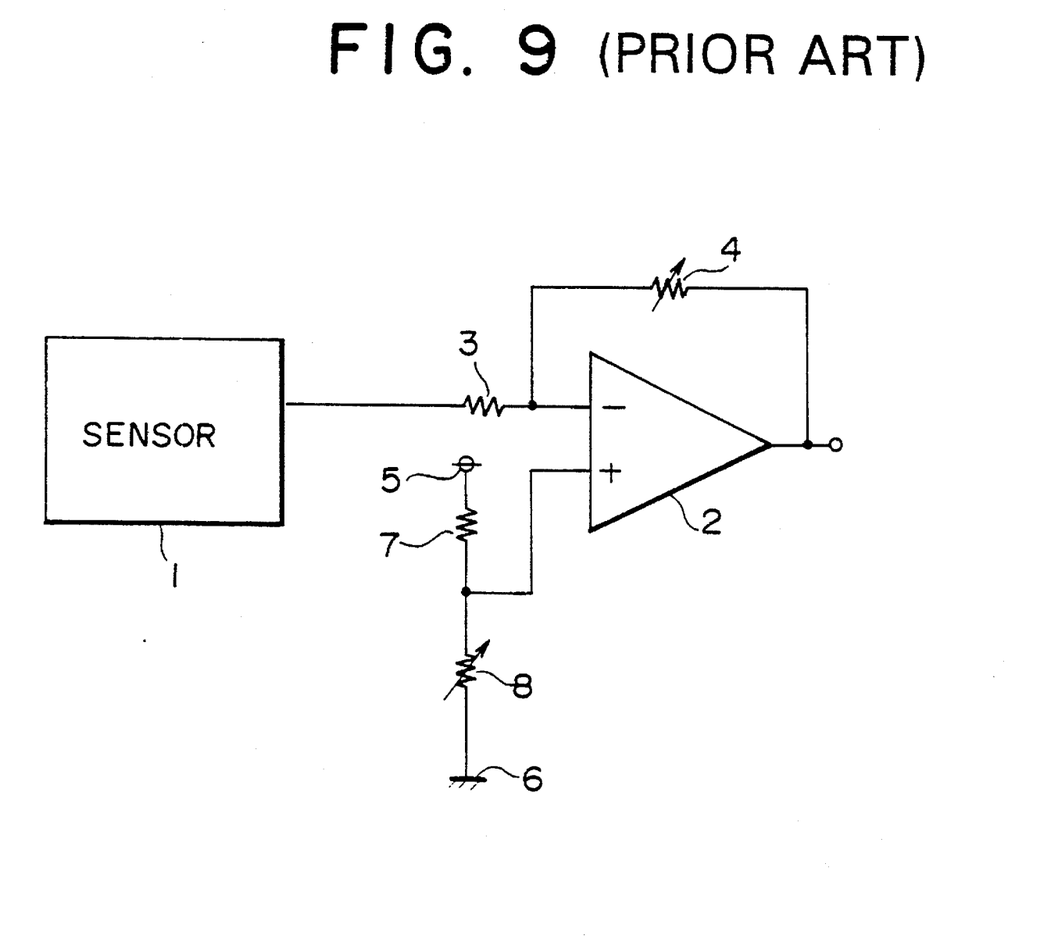
FIG. 9 is a circuit diagram showing a sensor characteristic adjustment circuit for adjusting the output characteristic of a semiconductor sensor.

FIG. 9 is a circuit diagram showing a sensor characteristic adjustment circuit for adjusting the output, characteristic of a semiconductor sensor. The output of a semiconductor sensor 1 is coupled to the inverting input terminal of an operational amplifier 2 through a resistor 3. A variable resistor 4 is coupled across the inverting input terminal and the output terminal of the operational amplifier 2. Across a reference voltage source 5 and the ground 6 are coupled, serially a resistor 7 and a variable resistor 8. The positive (non-inverted) input terminal of the operational amplifier 2 is coupled to the junction point between the resistor 7 and the variable resistor 8.

Next, the operation of the circuit of FIG. 9 is described. Let $V_S$ represent the output voltage of the semiconductor sensor 1, $V_O$ represent the output voltage of the operational amplifier 2, $R_3$ represent the resistance of the resistor 3, $R_4$ represent the variable resistance of the variable resistor 4, and $V_P$ represent the input voltage to the positive (non-inverted) input terminal of the operational amplifier 2. Then, the output voltage $V_O$ of the operational amplifier 2 is given by:

$$V_O = V_P(1 + R_4/R_3) - (V_S(R4/R3)$$

Further, let $R_8$ represent the variable resistance of the variable resistor 8. Then, the input voltage $V_P$ to the positive (non-inverted) input terminal of the operational amplifier 2 is then given by:

$$V_P = V_{REF}(R_8 \cdot (R_7 + R_8))$$

Thus, the output $V_O$ of the operational amplifier 2 is given by:

$$V_O = V_{REF}(R_8 \cdot (R_7 + R_8))(1 + R_4/R_3) - (V_S(R4/R3)$$

In the last equation, the first term on the right hand side represents the setting of the offset level of the sensor characteristic adjustment circuit and the second term represents the setting level of the sensitivity thereof.

Thus, when the output voltage of the semiconductor sensor 1 is 0, only the first term remains in the right hand side of the last equation. The first term does not depend on the output voltage $V_S$ of the semiconductor sensor 1 and hence is a constant. The first term is thus the offset of the sensor characteristic adjustment circuit. On the other hand, the second term is proportional to the output voltage $V_S$ of the semiconductor sensor 1 and thus represents the sensitivity of the sensor characteristic adjustment circuit. The semiconductor sensor 1 may exhibit a random sensitivity variation due to production variations, etc. However, the output $V_O$ of the operational amplifier 2 (namely, the output of the sensor characteristic adjustment circuit) can be adjusted to a predetermined sensitivity level by adjusting the variable resistance $R_4$.

The sensitivity and the offset of the sensor characteristic adjustment circuit of FIG. 9 can be adjusted as follows. First, resistance of the variable resistor 4 is adjusted to set the sensitivity of the output of the sensor characteristic adjustment circuit. Next, the resistance of the variable resistor 8 is adjusted to set the offset thereof.

By the way, in the case of the sensor characteristic adjustment circuit of FIG. 9, the operational amplifier 2 is operated as an inverting amplifier. Thus, as the output $V_S$ of the semiconductor sensor 1 increases, the output $V_O$ of the sensor characteristic adjustment circuit decreases. However, the output of the operational amplifier 2 may be coupled to another inverting amplifier, such that the output of the sensor characteristic adjustment circuit has the same polarity as the output $V_S$ of the semiconductor sensor 1.

The conventional sensor characteristic adjustment circuit of FIG. 9, however, has the disadvantage that variable resistors 4 and 8 are necessary for adjusting the characteristic (i.e., the sensitivity and the offset) thereof. This constitutes an obstacle to a higher degree of integration of the semiconductor sensor 1 and the operational amplifier 2 in an integrated circuit (IC).

SUMMARY OF THE INVENTION

It is therefore an object of this invention to provide a sensor characteristic adjustment circuit in which variable resistors are not necessary for the adjustment of the sensitivity and the offset, and which hence allows a high degree of circuit integration. A further object is to provide such a sensor characteristic adjustment circuit which is immune to the adverse effects of noise.

Still further, this invention aims at providing a sensor characteristic adjustment circuit in which the proper levels of the sensitivity and the offset can be easily selected by monitoring the output before the sensitivity and the offset are finally set.

The first of the above objects is accomplished in accordance with the principle of this invention by a sensor characteristic adjustment circuit for adjusting the output characteristic of a sensor which comprises data conversion means for converting serial data bits corresponding to an adjustment characteristic into parallel data bits; non-volatile memory means coupled to the data conversion means and having memory cells for storing parallel data bits output from the data conversion means; and adjustment means, coupled to the non-volatile memory means, for adjusting an output of the sensor in accordance with the parallel data bits stored in the non-volatile memory means.

Preferably, the serial data bits include: first bits corresponding to an offset of the sensor characteristic adjustment circuit, and second bits corresponding to a sensitivity of the sensor characteristic adjustment circuit; data conversion means converting the first serial data bits into first parallel data bits and the second serial data bits into second parallel data bits; the main memory cells of the non-volatile memory means includes: first memory cells for storing the first parallel data bits, and second memory cells for storing the second parallel data bits; and the adjustment means includes: first adjustment means for setting the offset of the sensor characteristic adjustment circuit in accordance with the first parallel data bits, and second adjustment means for setting the sensitivity of the sensor characteristic adjustment circuit in accordance with the second parallel data bits. Preferably, the first adjustment means includes: first D/A converter means, coupled to the first memory cells, for effecting digital-to-analog conversion of the first parallel data bits; and an adder means, coupled to the sensor and the first D/A converter means, for adding an output of the first D/A converter to an output of the sensor; and the second adjustment means includes: second D/A converter means, coupled to the second memory cells, for effecting digital-to-analog conversion of the second parallel data bits; and amplifier means, having an input terminal coupled to the adder, for amplifying an output of the adder by an amplification factor corresponding to an output of the second D/A converter means.

To accomplish the second object, the circuit includes gate means, inserted between the data conversion means and the non-volatile memory means, for separating the non-volatile memory means from the data conversion means after the parallel data bits output from the data conversion means are written into the non-volatile memory means. Preferably, the gate means includes: an additional memory cell for storing a write suppression bit; main AND gates having: non-inverted inputs coupled to the parallel data bits output from the data conversion means, and inverted inputs coupled to an output of the memory cell means, outputs of the main AND gates being coupled to inputs to respective bits in the non-volatile memory means. It is further preferred that the sensor characteristic adjustment circuit further includes: a first additional AND gate having an non-inverted input for receiving a write enable signal, an output of the first AND gate being coupled to the additional memory cell for storing the write suppression bit; timer means, having an input coupled to the output of the first additional AND gate, for holding a high level of the output of the additional AND gate for a predetermined length of time; a second additional AND gate having: a non-inverted input coupled to the additional memory cell for storing the write suppression bit; and an inverted input coupled to an output of the timer means, wherein the output of the second additional AND gate is coupled to inverted input terminals of the main AND gates and the first additional AND gate.

For accomplishing the last-mentioned object, the adjustment means is further coupled to the data conversion means, and the sensor characteristic adjustment circuit further includes: first gate means, inserted between the data conversion means and the adjustment means, for separating the adjustment means from the data conversion means after the parallel data bits supplied from the data conversion means are written into the non-volatile memory means; and second gate means, inserted between the non-volatile memory means and the adjustment means, for separating the adjustment means from the non-volatile memory means before the parallel data bits supplied from the data conversion means are written into the non-volatile memory means.

Preferably, the circuit further includes an additional memory cell for storing a write enable bit; and the first gate means includes: first tri-state buffer gates inserted between the main memory cells of the non-volatile memory means and inputs to the adjustment means, the first tri-state buffer gates having non-inverted control terminals coupled to an output of the additional memory cell for storing write enable bit; and the second gate means includes second tri-state buffer gates inserted between the parallel data bits supplied from the data conversion means and the inputs to the adjustment means, the second tri-state buffer gates having inverted control terminals coupled to the output of the additional memory cell for storing the write enable bit. It is further preferred that the data conversion means includes selector means for selectively converting the first serial data bits into the first parallel data bits and the second serial data bits into the second parallel data bits.

BRIEF DESCRIPTION OF THE DRAWINGS

The features which are believed to be characteristic of this invention are set forth with particularity in the appended claims. The structure and method of operation of this invention itself, however, will be best understood from the following detailed description taken in conjunction with the accompanying drawings in which:

In the drawings, like reference numerals represent like or corresponding parts or portions.

DETAILED DESCRIPTION OF THE PREFERRED EMBODIMENTS

Referring now to the accompanying drawings, the preferred embodiments of this invention are described.

Figure 1:
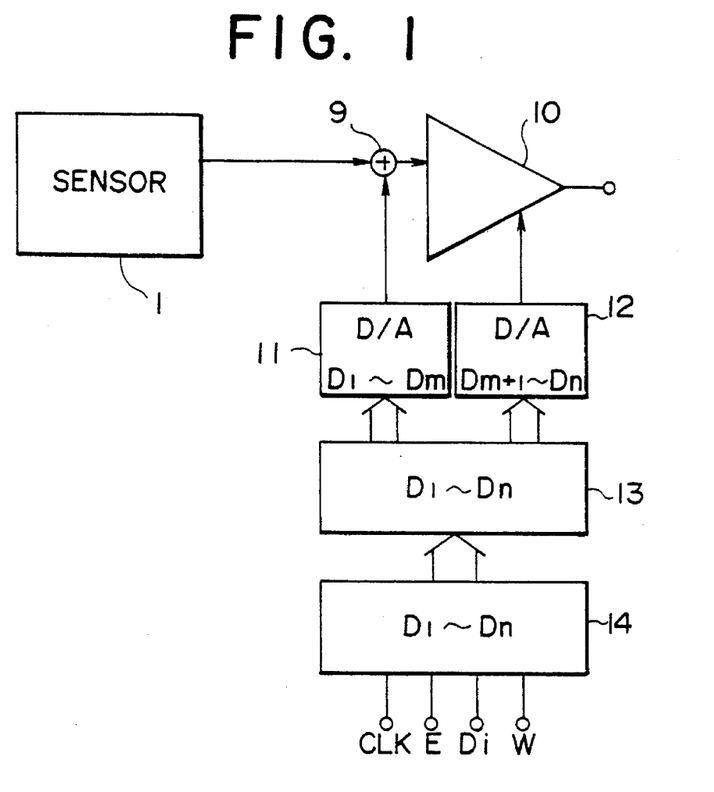
FIG. 1 is a block diagram showing the structure of a sensor characteristic adjustment circuit according to a first embodiment of this invention.

FIG. 1 is a block diagram showing the structure of a sensor characteristic adjustment circuit according to a first embodiment of this invention. An adder 9, having inputs coupled to the outputs of a semiconductor sensor 1 and a D/A converter 11, respectively, adds the offset corresponding to the output of the D/A converter 11 to the output of the semiconductor sensor 1. The adder 9 outputs the sum to the voltage controlled amplifier 10. The control terminal of the voltage controlled amplifier 10 is coupled to the output of the D/A converter 12. The amplification factor of the voltage controlled amplifier 10, determined by the value of the output of the D/A converter 12, corresponds to the sensitivity of the sensor characteristic adjustment circuit. A non-volatile memory 13 supplies the digital values corresponding to the offset and the sensitivity to the D/A converters 11 and 12, respectively. A serial-parallel converter 14 converts the serial data input thereto into parallel data written into the non-volatile memory 13.

Figure 2:
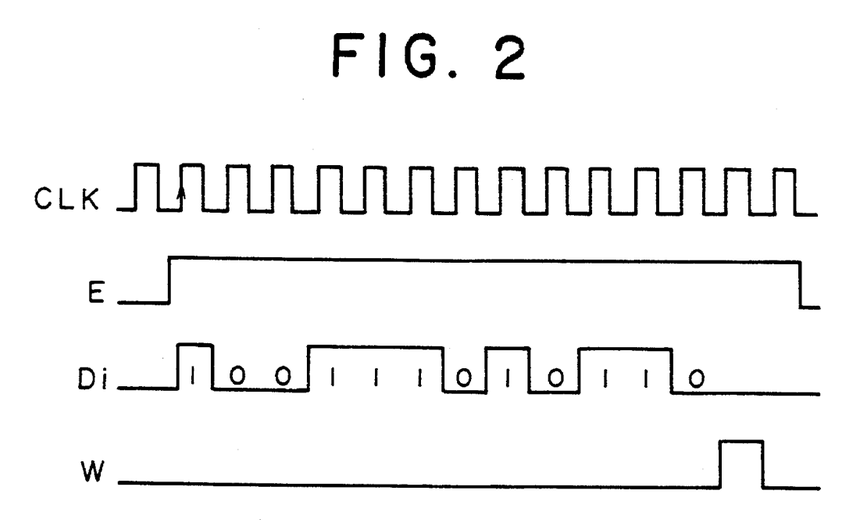
FIG. 2 shows various waveforms input to the serial-parallel converter of the sensor characteristic adjustment circuit of FIG. 1.

FIG. 2 shows various waveforms input to the serial-parallel converter of the sensor characteristic adjustment circuit of FIG. 1, wherein the waveforms of the signals are denoted by the same reference symbols as the input terminals of the serial-parallel converter 14. Next, referring to FIG. 2, the operation of the sensor characteristic adjustment circuit of FIG. 1 is described. The serial-parallel converter 14 converts the serial data input to the data input terminal $D_i$ into parallel data $D_1$ through $D_n$ (n=12) of 12 bits and outputs the parallel data to the non-volatile memory 13. This operation is performed as follows.

As shown in FIG. 2, to the clock terminal CLK of the serial-parallel converter 14 are input the clock pulses CLK which serve as the reference for the operation cycles of the serial-parallel converter 14. At each rising edge of the clock pulses CLK, the serial-parallel converter 14 takes in the serial data bit $D_i$ input to the data input terminal $D_i$ thereof when the enable signal E is at the high level H. So long as the enable signal E (inverted reset signal) applied to enable terminal (reset terminal) E is at the low level L, the parallel outputs $D_1$ through $D_n$ are all at the low level L. When the enable signal E applied to the reset terminal E rises to the high level H, the serial-parallel converter 14 takes in the serial data bits $D_i$ in synchronism with the clock pulses CLK and outputs the parallel data bits $D_1$ through $D_n$.

The non-volatile memory 13 includes twelve memory cells (memory elements) each storing a bit of the parallel data $D_1$ through $D_n$ consisting of 12 bits. After the signal applied to the reset terminal E of the serial-parallel converter 14 rises to the high level H, the serial-parallel converter 14 takes in the data from the data input terminal $D_i$ for n (=12) clock pulses. When the write signal W applied to the write terminal W of the serial-parallel converter 14 rises to the high level H at the (n+1)th clock pulse, the parallel data bits $D_1$ through $D_n$ output from the serial-parallel converter 14 are written into the non-volatile memory 13. Once the data is thus written into the non-volatile memory 13, the data stored in the non-volatile memory 13 cannot be overwritten.

The parallel data bits $D_1$ through $D_n$ are thus written into the non-volatile memory 13. Among the parallel data bits $D_1$ through $D_n$, the first through mth bits $D_1$ through $D_m$ are input to the digital input terminals of the D/A converter 11. The remaining (m+1)th through nth bits $D_{m+1}$ through $D_n$ are input to the digital input terminals of the D/A converter 12.

The D/A converter 11 converts the first m data bits $D_1$ through $D_m$ into corresponding analog data and outputs it to the adder 9. The adder 9 adds the output of the D/A converter 11 to the output of the semiconductor sensor 1 as the offset, and outputs the sum to the voltage controlled amplifier 10. On the other hand, the D/A converter 12 converts the remaining data bits $D_{m+1}$ through $D_n$ to the corresponding analog value and outputs it to the control terminal of the voltage controlled amplifier 10. As a result, the voltage controlled amplifier 10 amplifies the input signal supplied from the adder 9 at the amplification factor corresponding to the value represented by the bits $D_{m+1}$ through $D_n$ supplied from the D/A converter 12. Thus the output of the semiconductor sensor 1 is adjusted with the offset and the sensitivity represented by the data bits $D_1$ through $D_m$ and $D_{m+1}$ through $D_n$, respectively, via the adder 9 and the voltage controlled amplifier 10. The adjusted sensor signal is output from the voltage controlled amplifier 10.

Figure 3:
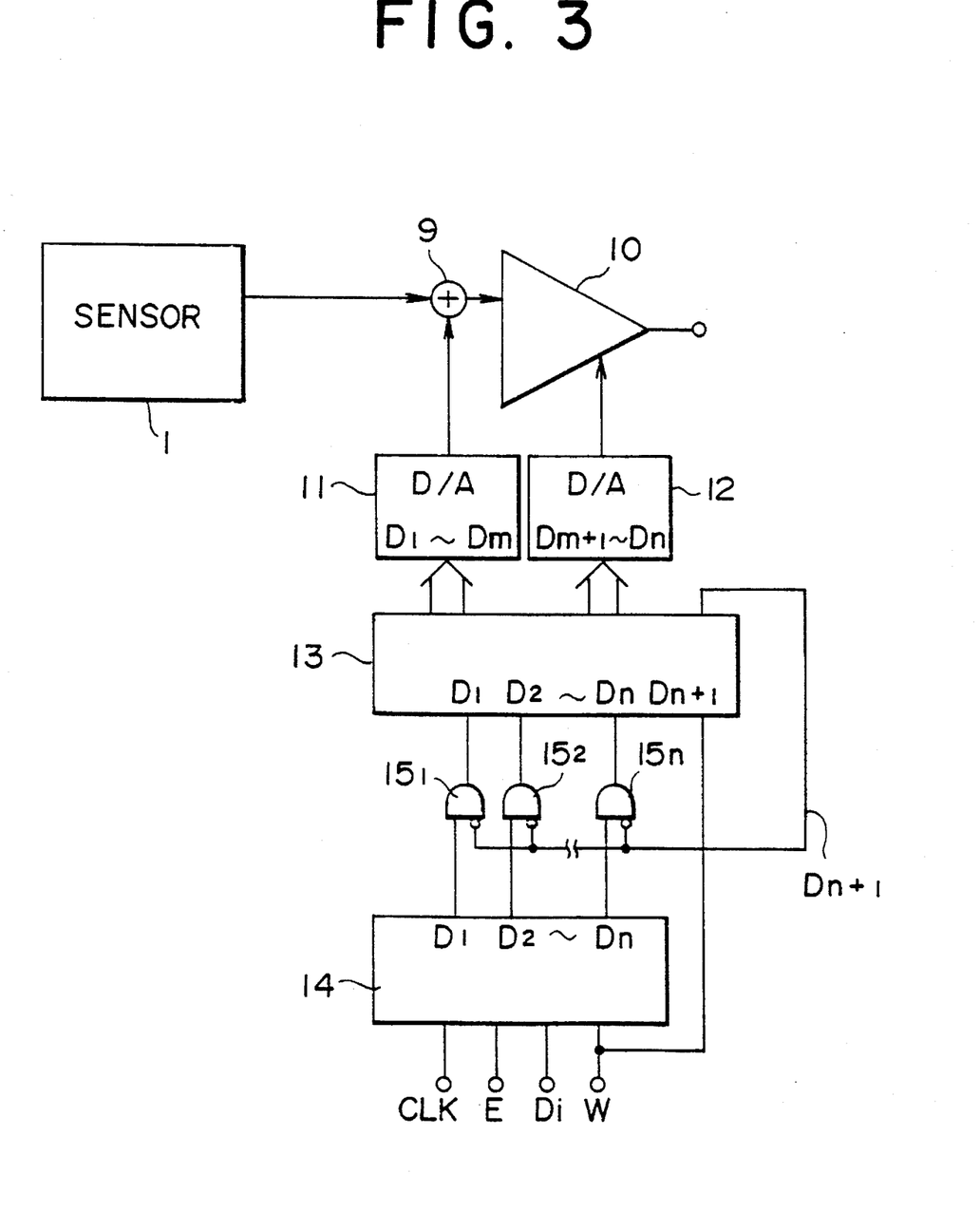
FIG. 3 is a block diagram showing the structure of a sensor characteristic adjustment circuit according to a second embodiment of this invention.

FIG. 3 is a block diagram showing the structure of a sensor characteristic adjustment circuit according to a second embodiment of this invention. The sensor characteristic adjustment circuit of FIG. 3 has a structure similar to that of the sensor characteristic adjustment circuit of FIG. 1, except that it includes the gates $15_1$ through $15_n$ and the non-volatile memory 13 is provided with a (n+1)th memory cell coupled to the write terminal W. Namely, the non-volatile memory 13 includes (n+1) memory cells, wherein the first n cells $D_1$ through $D_n$ are coupled to the gates $15_1$ through $15_n$, and the (n+1)th memory cell $D_{n+1}$ is directed coupled to the write terminal W.

The non-inverting input terminals of the gates $15_1$ through $15_n$ are coupled respectively to the parallel outputs $D_1$ through $D_n$ of the serial-parallel converter 14. The inverted input terminals of the gates $15_1$ through $15_n$ are coupled to the output of the memory cell $D_{n+1}$ of (n+1)th bit of the non-volatile memory 13. The respective gates $15_1$ through $15_n$ input the logical products (i.e., the ANDs) of the outputs $D_1$ through $D_n$ of the serial-parallel converter 14 and the negation of the output $D_{n+1}$ of the (n+1)th bit of the non-volatile memory 13.

Figure 4:
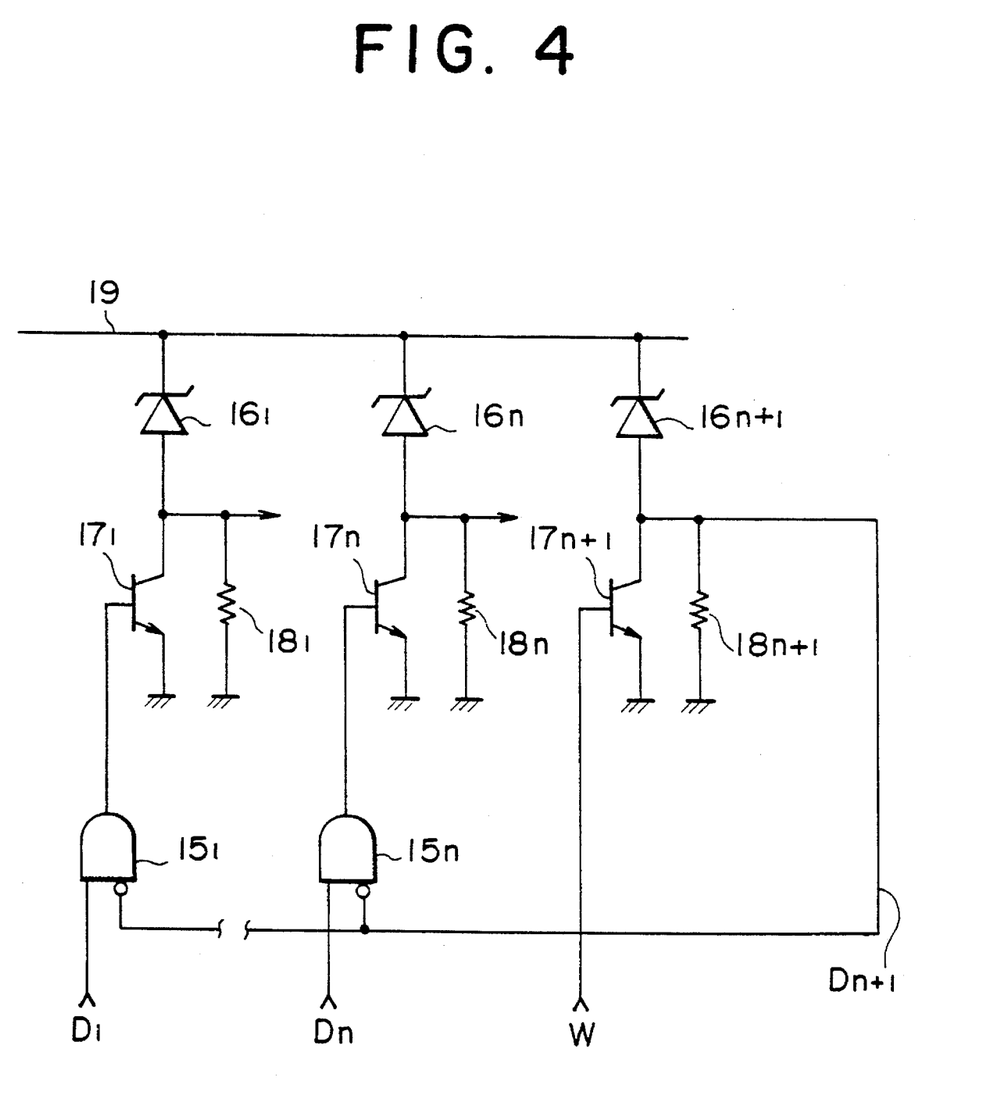
FIG. 4 is a circuit diagram showing the interior structure of the non-volatile memory 13 of FIG. 3.

The writing of the data from the serial-parallel converter 14 to the non-volatile memory 13 is performed before the output $D_{n+1}$ of the (n+1)th bit of the non-volatile memory 13 rises to the high level H. When the signal applied to the write terminal W rises to the high level H and the logical value 1 is written in at the (n+1)th bit of the non-volatile memory 13, thereby raising the output $D_{n+1}$ to the high level H, the outputs of the respective gates $15_1$ through $15_n$ are all reduced to the low level L. Thus, irrespective of the values of the parallel data outputs $D_1$ through $D_n$ of the serial-parallel converter 14, the inputs $D_1$ through $D_n$ to the non-volatile memory 13 are all reduced to the low level and thus the writing of new data into the non-volatile memory 13 becomes impossible. Thus, even if the serial-parallel converter 14 acts erroneously, the non-volatile memory 13 is not affected. The circuit of FIG. 3 is thus able to be used in a noisy environment without being affected by the noise FIG. 4 is a circuit diagram showing the interior structure of the non-volatile memory 13 of FIG. 3. The memory cells of the non-volatile memory 13 includes the avalanche diodes $16_1$ through $16_{n+1}$. The avalanche diodes $16_1$ through $16_{n+1}$ may be made by inversely coupling the base-emitter diodes of NPN transistors. The avalanche diodes $16_1$ through $16_{n+1}$ usually exhibit a breakdown voltage at about 6 to 9 V. The avalanche diodes $16_1$ through $16_{n+1}$ are coupled serially with transistors $17_1$ through $17_{n+1}$, respectively, and each one of the serial connections of the avalanche diodes $16_1$ through $16_{n+1}$ and the transistors $17_1$ through $17_{n+1}$ is coupled across the word line 19 and the ground. The junction points between the avalanche diodes $16_1$ through $16_{n+1}$ and the transistors $17_1$ through $17_{n+1}$, the outputs of the respective memory cells, are coupled to the ground via resistors $18_1$ through $18_{n+1}$.

The bases of the transistors $17_1$ through $17_n$ are coupled respectively to the outputs of the gates $15_1$ through $15_n$. When the outputs of the corresponding gates $15_1$ through $15_n$ rise to the high level H, the transistors $17_1$ through $17_n$ are turned on and a bit is written into each of the avalanche diodes $16_1$ through $16_n$, provided that the word line 19 is receiving a high voltage. The base of the transistor $17_{n+1}$ is coupled to the write terminal W, and when the write signal W rises to the high level H, the transistor $17_{n+1}$ is turned on and the avalanche diode $16_{n+1}$ breaks down, such that the inverted input $D_{n+1}$ applied to the gates $15_1$ through $15_n$ rises to the high level H. More specifically, the parallel data $D_1$ through $D_n$ is written into the avalanche diodes $16_1$ through $16_n$ constituting the memory cells of the non-volatile memory 13 as follows.

When the avalanche diode $16_{n+1}$ has not yet been broken down and the signal applied to the write terminal W is at the low level L, the transistor $17_{n+1}$ is turned off and the inverted input $D_{n+1}$ to the respective gates $15_1$ through $15_n$ are at the low level L. Thus the gates $15_1$ through $15_n$ are open. Under this circumstance the parallel data $D_1$ through $D_n$ converted by the serial-parallel converter 14 are input to the gates $15_1$ through $15_n$, respectively. The outputs of the respective gates $15_1$ through $15_n$ thus take the high level H or the low level L in accordance with the logical value 1 or 0 of the parallel data $D_1$ through $D_n$. As a result, the respective transistors $17_1$ through $17_n$ are turned on or off in accordance with the logical value 1 or 0 of the parallel data $D_1$ through $D_n$. Under this circumstance, a voltage is applied to the word line 19 (e.g., 15 V) that is higher than the breakdown voltage of the avalanche diodes. Thus through the avalanche diodes $16_1$ through $16_n$ corresponding to the logical value 1 of the parallel data $D_1$ through $D_n$ flows a large current of about several tens of mA. Thus the avalanche diodes $16_1$ through $16_n$ corresponding to the logical value 1 of the parallel data $D_1$ through $D_n$ are short-circuited, and the data corresponding to the parallel data $D_1$ through $D_n$ are written into the avalanche diodes $16_1$ through $16_n$. When, for example, serial signal $D_i$ shown in FIG. 2 is supplied to the serial-parallel converter 14, the first bit $D_1$ has logical value 1, and hence a large current flows through the avalanche diode $16_1$. As a result the avalanche diode $16_1$ breaks down and stores the logical value 1. On the other hand, the last bit $D_n$ has the logical value 0, and the avalanche diode $16_n$ does not break down. As a result the avalanche diode $16_n$ stores the logical value 0.

When the data is thus written into the avalanche diodes $16_1$ through $16_n$, the write terminal W rises to the high level H. As a result, the transistor $17_{n+1}$ is turned on and the avalanche diode $16_{n+1}$ breaks down. Thereafter the voltage on the word line 19 is reduced to about 3 to 5 V. However, the avalanche diode $16_{n+1}$ is already short-circuited. When the voltage applied to the write terminal W is reduced to the low level L, the transistor $17_{n+1}$ is turned off. Thus, the inverted input $D_{n+1}$ of the gates $15_1$ through $15_n$ rises to the high level H, and thereby turns off the gates $15_1$ through $15_n$.

Thereafter, so long as the write terminal W is kept at the low level L, the input $D_{n+1}$ to the gates $15_1$ through $15_n$ remains at the high level H, and the gates $15_1$ through $15_n$ are all closed. Thus, even if the serial-parallel converter 14 operates erroneously, the non-volatile memory 13 is not affected. The parallel data $D_1$ through $D_n$ stored in the respective avalanche diodes $16_1$ through $16_n$ are supplied to the D/A converter 11 and the D/A converter 12 as the respective output voltages H or L at the junction points between the resistors $18_1$ through $18_n$ and the respective avalanche diodes $16_1$ through $16_n$.

Figure 5:
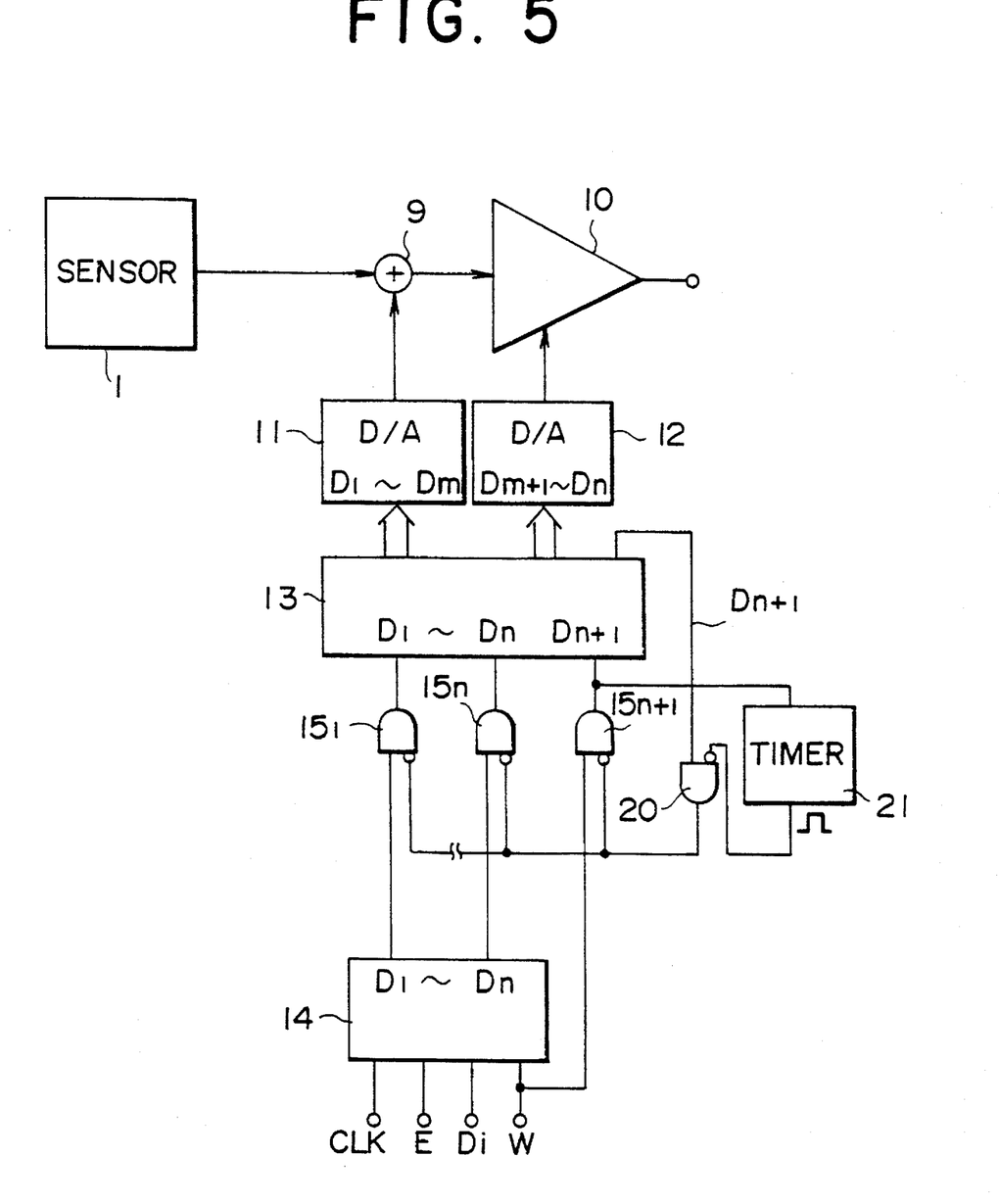
FIG. 5 is a block diagram showing the structure of a sensor characteristic adjustment circuit according to a third embodiment of this invention.

FIG. 5 is a block diagram showing the structure of a sensor characteristic adjustment circuit according to a third embodiment of this invention. In the case of the second embodiment, the (n+1)th bit output $D_{n+1}$ of the non-volatile memory 13 is directly coupled to the inputs of the gates $15_1$ through $15_n$, to separate the non-volatile memory 13 from the serial-parallel converter 14 after the writing of data is completed. In the case of the circuit of FIG. 5, however, the write terminal W is coupled to the input terminal $D_{n+1}$ of the non-volatile memory 13 through a gate $15_{n+1}$ and the output $D_{n+1}$ of the non-volatile memory 13 is input to the respective gates $15_1$ through $15_{n+1}$ through a gate 20. Further, a timer 21, having an input supplied from the output of the gate $15_{n+1}$, is triggered at the rising edge of the input and holds the high level H for a length of time needed to break down the avalanche diodes to input the high level H to the inverted terminal of the gate 20.

Writing of data into the non-volatile memory 13 of FIG. 5 is effected as follows. When the write terminal W is at the low level L and the data is not yet written into the non-volatile memory 13, the output of the gate $15_{n+1}$ is at the low level L, and hence the output $D_{n+1}$ of the non-volatile memory 13 is also at the low level L. Thus, the inverting inputs to the gates $15_1$ through $15_{n+1}$ are all at the low level L, and the gates $15_1$ through $15_{n+1}$ are open.

Under this circumstance, upon the write terminal W is applied the high level H. Further, a high voltage is applied on the word line of the non-volatile memory 13, to write in the data. Namely, when the write terminal W is raised to the high level H, the output of the gate $15_{n+1}$ rises to the high level H, such that the output of the timer 21 is maintained at the high level H for a predetermined length of time. The inverting input of the gate 20 receives the output of the timer 21. Thus, the output of the gate 20 is kept at the low level L for the predetermined time length, and the gates $15_1$ through $15_{n+1}$ remain open during this predetermined length of time. Thus, during this length of time, the input terminals $D_1$ through $D_n$ and $D_{n+1}$ are maintained at the same levels as the outputs $D_1$ through $D_n$ of the serial-parallel converter 14 and the write terminal W, respectively, and the data bits are thus written into the respective memory cells of the non-volatile memory 13.

When the output of the timer 21 returns to the low level L after the writing of data into the non-volatile memory 13 is completed, the gate 20 opens after the predetermined length of time and outputs the high level H of the output $D_{n+1}$ of the non-volatile memory 13 therefrom. Thus, the gates $15_1$ through $15_{n+1}$ having inverting inputs coupled to the output of the gate 20 are all closed, and the non-volatile memory 13 is separated from the serial-parallel converter 14. By the way, the length of time during which the high level H is kept by the timer 21 must be set longer than the time during which the write terminal W is kept at the high level H.

Figure 6:
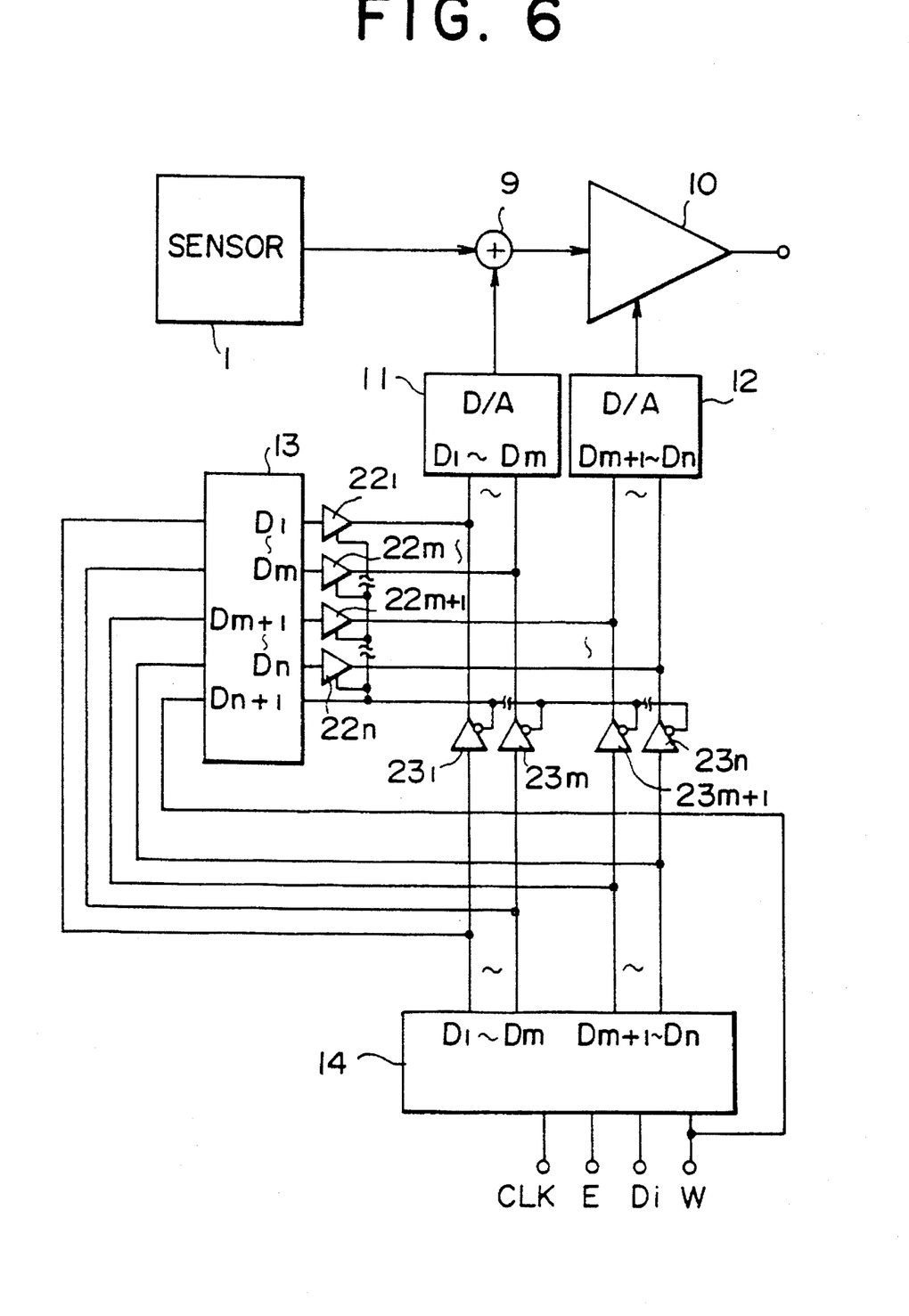
FIG. 6 is a block diagram showing the structure of a sensor characteristic adjustment circuit according to a fourth embodiment of this invention.

FIG. 6 is a block diagram showing the structure of a sensor characteristic adjustment circuit according to a fourth embodiment of this invention. The circuit of FIG. 6 is distinguished from that of FIG. 1 in the following points. The non-volatile memory 13 includes, as well as the memory cells for storing the data $D_1$ through $D_n$, a memory cell $D_{n+1}$ coupled directly to the write terminal W. Further, the outputs $D_1$ through $D_n$ of the non-volatile memory 13 are input to the D/A converter 11 and the D/A converter 12 through tri-state buffer gates $22_1$ through $22_n$. The control terminals of the tri-state buffer gates $22_1$ through $22_n$ are coupled to the output $D_{n+1}$ of the non-volatile memory 13. Furthermore, the outputs $D_1$ through $D_n$ of the serial-parallel converter 14 are input to the corresponding bits of the D/A converter 11 and the D/A converter 12 through tri-state buffer gates $23_1$ through $23_n$. The inverting control terminals of the tri-state buffer gates $23_1$ through $23_n$ are coupled to the output $D_{n+1}$ of the non-volatile memory 13.

The method of operation of the circuit of FIG. 6 is as follows, When the write terminal W is at the low level L and the writing of data into the non-volatile memory 13 is not yet effected, the output $D_{n+1}$ of the non-volatile memory 13 is at the low level L. Thus, under this circumstance, the tri-state buffer gates $22_1$ through $22_n$ are closed while the tri-state buffer gates $23_1$ through $23_n$ are open. Thus when the writing of data into the non-volatile memory 13 is not yet effected and the output $D_{n+1}$ of the non-volatile memory 13 is at the low level L, the outputs $D_1$ through $D_n$ of the serial-parallel converter 14 are input to the D/A converter 11 and the D/A converter 12 through the tri-state buffer gates $23_1$ through $23_n$.

Thereafter, the write terminal W is raised to the high level H and the data is written into the non-volatile memory 13.

As a result, the tri-state buffer gates $22_1$ through $22_n$ are opened and the tri-state buffer gates $23_1$ through $23_n$ are closed. Namely, after the parallel data $D_1$ through $D_n$ is written into the non-volatile memory 13, the output $D_{n+1}$ of the non-volatile memory 13 rises to the high level H, and the outputs $D_1$ through $D_n$ of the non-volatile memory 13 are input to the D/A converter 11 and the D/A converter 12 through the tri-state buffer gates $22_1$ through $22_n$.

The circuit of FIG. 6 has the following advantage compared with the previous embodiments. In the case of the sensor characteristic adjustment circuit of FIG. 4, the output values of the D/A converter 11 and the D/A converter 12 are not set until the write terminal W rises to the high level H and the data is written into the non-volatile memory 13. Thus the offset and the sensitivity of the output of the voltage controlled amplifier 10 are not set until the data is actually written into the non-volatile memory 13. Consequently, it is impossible to adjust the offset and the sensitivity to predetermined levels by monitoring the output values of the voltage controlled amplifier 10. The circuit of FIG. 6 solves this problem. In the case of the circuit of FIG. 6, the outputs $D_1$ through $D_n$ of the serial-parallel converter 14 are directly input to the D/A converter 11 and the D/A converter 12 before the data is written into the non-volatile memory 13. Thus, under this circumstance, the data $D_1$ through $D_n$ may be modified to adjust the offset and the sensitivity, by monitoring the output level of the voltage controlled amplifier 10.

Figure 7:
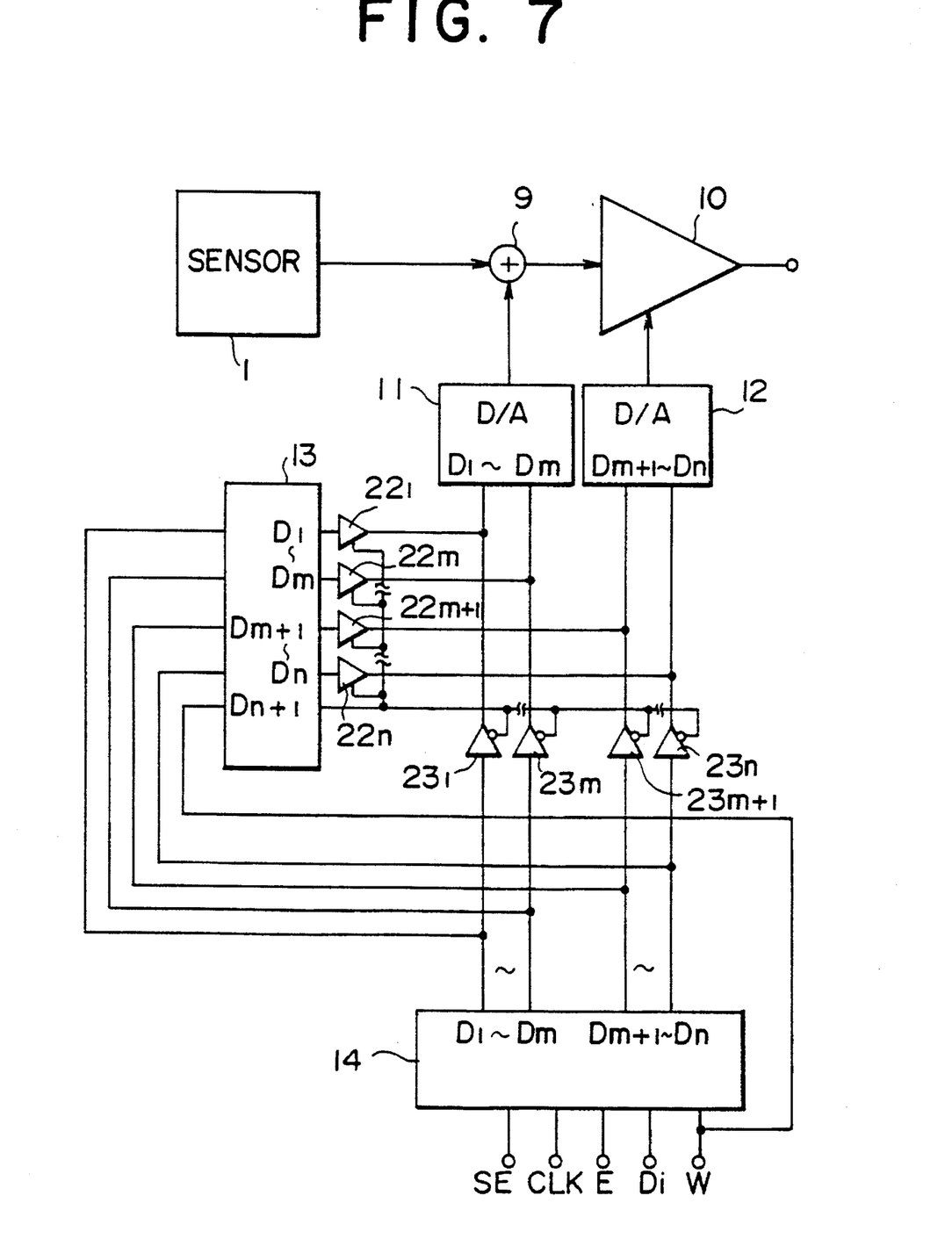
FIG. 7 is a block diagram showing the structure of a sensor characteristic adjustment circuit according to a fifth embodiment of this invention.

FIG. 7 is a block diagram showing the structure of a sensor characteristic adjustment circuit according to a fifth embodiment of this invention. The circuit of FIG. 7 is similar to that of FIG. 6 except for the following points. The serial-parallel converter 14 is provided with a bit select terminal SE. When, for example, the bit select terminal SE is at the low level L, the serial-parallel converter 14 effects the serial-to-parallel conversion upon the serial input $D_i$ to obtain the first m parallel data bits $D_1$ through $D_m$ and holds the remaining data bits $D_{m+1}$ through $D_n$ unchanged. When, on the other hand, the bit select terminal SE is at the high level H, the serial-parallel converter 14 effects the serial-to-parallel conversion upon the serial data $D_i$ to obtain the latter parallel data bits $D_{m+1}$ through $D_n$ and holds the data bits $D_1$ through $D_m$ unchanged.

Thus selecting the level of the bit select terminal SE before the data is written into the non-volatile memory 13, the data bits $D_1$ through $D_m$ corresponding to the offset and the data bits $D_{m+1}$ through $D_n$ corresponding to the sensitivity can be adjusted separately by monitoring the output level of the voltage controlled amplifier 10. The respective appropriate pattern of data bits can thus be determined efficiently. The selected levels of the offset and the sensitivity may affect each other. Under such circumstances, it may become necessary to adjust the output of the D/A converter 11, then the output of the D/A converter 12, and then again the output of the D/A converter 11. In the case of the circuit of FIG. 7, the offset and the sensitivity can be adjusted repeatedly and efficiently, independently of each other, to obtain the predetermined sensitivity and offset. When the predetermined sensitivity and offset are thus obtained, the data bits may be written into the non-volatile memory 13 as a whole.

Figure 8:
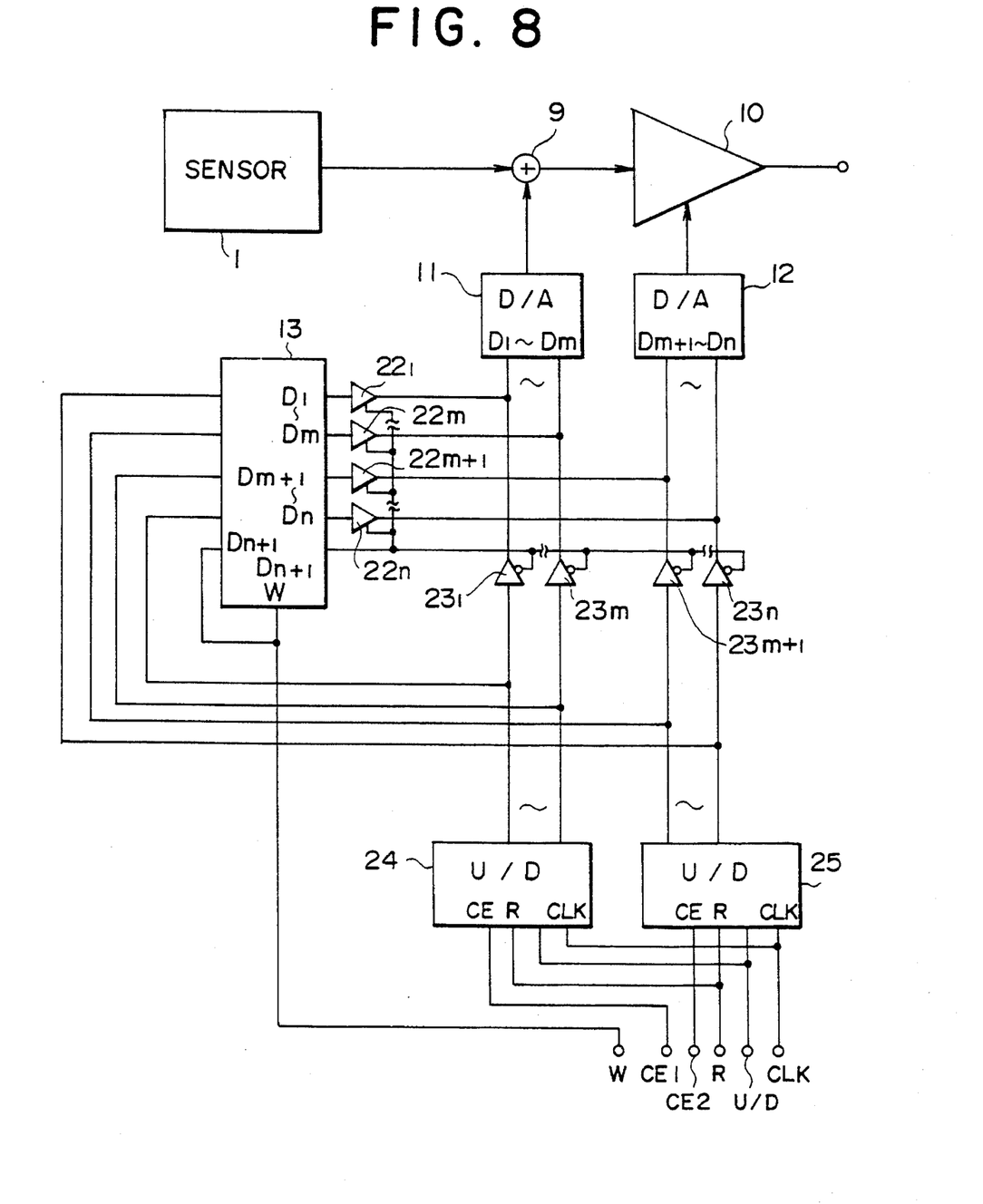
FIG. 8 is a block diagram showing the structure of a sensor characteristic adjustment circuit according to a sixth embodiment of this invention.

FIG. 8 is a block diagram showing the structure of a sensor characteristic adjustment circuit according to a sixth embodiment of this invention. In the case of this embodiment, the up-down counters 24 and 25 are used instead of the serial-parallel converter 14. The up-down counters 24 and 25 output the data bits corresponding to the offset and the sensitivity, respectively, to the D/A converter 11 and the D/A converter 12, respectively. The outputs $D_1$ through $D_m$ of the up-down counter 24 are coupled to the memory cells $D_1$ through $D_m$ of the non-volatile memory 13. The outputs $D_1$ through $D_m$ of the up-down counter 24 are also input to the D/A converter 11 through the tri-state buffer gates $23_1$ through $23_m$. The outputs $D_{m+1}$ through $D_n$ of the up-down counter 25 are coupled to the memory cells $D_{m+1}$ through $D_n$ of the non-volatile memory 13. The outputs $D_{m+1}$ through $D_n$ of the up-down counter 25 are also input to the D/A converter 12 through the tri-state buffer gates $23_{m+1}$ through $23_n$.

The write terminal W of the sensor characteristic adjustment circuit is coupled to the write terminal W of the non-volatile memory 13 and the memory cell $D_{n+1}$. The count enable terminals CE1 and CE2 of the sensor characteristic adjustment circuit are coupled to the count enable terminals of the up-down counters 24 and 25, respectively. The up-down terminal U/D, the reset terminal R, and the clock terminal CLK of the sensor characteristic adjustment circuit are coupled to the up-down terminal, the reset terminal R, and the clock terminal CLK of the up-down counters 24 and 25, respectively. Otherwise the circuit of FIG. 8 is similar to that of FIG. 7.

The method of operation of the up-down counters 24 and 25 are as follows. The up-down counters 24 and 25 count up or down in synchronism with the pulses applied upon the clock terminal CLK thereof. When the up-down terminal U/D is at the high level H, the up-down counters count up (i.e., increments the count value stored therein), and when the up-down terminal U/D is at the low level L, the up-down counters count down (i.e., decrements the count value stored therein). The values stored in the up-down counters 24 and 25 are output as the parallel data $D_1$ through $D_m$ and $D_{m+1}$ through $D_n$, respectively. The up-down counters 24 and 25 operate independently of each other by means of the count enable terminals CE1 and CE2. For example, when the count enable terminal CE1 is at the high level H and the count enable terminal CE2 is at the low level L, only the up-down counter 24 performs the counting (i.e., counts up or down in accordance with the level of the signal at the up-down terminal U/D), and the data value stored in the up-down counter 25 is maintained without change. Under this circumstance, the output of the up-down counter 25 is fixed and only the output of the up-down counter 24 varies.

Thus, by monitoring the output of the voltage controlled amplifier 10 before the data is written into the non-volatile memory 13, only the offset, for example, may be adjusted. Thus, only the output of the up-down counter 24 is modified by monitoring the output of the voltage controlled amplifier 10. When the output of the up-down counter 24 is too large, the signal at the up-down terminal U/D is reduced to the low level L such that the up-down counter 24 counts down. Thereby, fine adjustment of the offset can be effected efficiently. The sensitivity of the sensor characteristic adjustment circuit which is determined by the output value of the up-down counter 25 may be selected similarly. After the offset and the sensitivity are thus selected, the data is written into the non-volatile memory 13.

It is noted that the above first through sixth embodiments may be combined. For example, the third and the fourth embodiments, or the third and the sixth embodiments may be combined beneficially.

What is claimed is:

1. A sensor characteristic adjustment circuit for adjusting the output characteristic of a sensor comprising:

data conversion means for converting serial data bits corresponding to an adjustment characteristic into parallel data bits, the serial data bits including first bits corresponding to an offset of said sensor characteristic adjustment circuit and second bits corresponding to a sensitivity of said sensor characteristic adjustment circuit, said data conversion means converting the first serial data bits into first parallel data bits and the second serial data bits into second parallel data bits;

non-volatile memory means coupled to said data conversion means and having memory cells for storing parallel data bits output from said data conversion means;

first adjustment means coupled to said non-volatile memory means and the sensor for setting the offset of said sensor characteristic adjustment circuit in accordance with the first parallel data bits, said first adjustment means comprising a first digital-to-analog converter coupled to said non-volatile memory means for effecting digital-to-analog conversion of the first parallel data bits, and a summing circuit coupled to the sensor and said first digital-to-analog converter for adding an output of said first digital-to-analog converter to an output of the sensor;

second adjustment means coupled to said non-volatile memory means and the sensor for setting the sensitivity of said sensor characteristic adjustment circuit in accordance with the second parallel data bits, said second adjustment means comprising a second digital-to-analog converter coupled to said nonvolatile memory means for effecting digital to analog conversion of the second parallel data bits, and an amplifier circuit coupled to said summing circuit;

first buffer means connected between said non-volatile memory means and said first and second digital-to-analog converters; and second buffer means connected between said data conversion means and said first and second digital-to-analog converters.

2. The sensor characteristic adjustment circuit of claim 1 wherein said memory cells of said non-volatile memory means include first memory cells for storing the first parallel data bits and second memory cells for storing the second parallel data bits.

3. The sensor characteristic adjustment circuit of claim 2 wherein said first converter is coupled to said first memory cells and said second digital-to-analog converter is coupled to said second memory cells.

4. The sensor characteristic adjustment circuit of claim 3 wherein said amplifier circuit includes an input terminal coupled to said summing circuit and a control input coupled to said second digital-to-analog converter for amplifying an output of said summing circuit by an amplification factor corresponding to an output of said second digital-to-analog converter.

5. A sensor characteristic adjustment circuit as claimed in claim 1 comprising:

gate means, inserted between said data conversion means and said non-volatile memory means, for separating said non-volatile memory means from said data conversion means after the parallel data bits output from said data conversion means are written into said non-volatile memory means.

6. The sensor characteristic adjustment circuit of claim 5 wherein said gate means includes:

an additional memory cell for storing a write suppression bit;

main AND gates having non-inverting inputs coupled to the parallel data bits output from said data conversion means and inverting inputs coupled to an output of said memory cell means, outputs of said main AND gate being coupled to inputs of respective bits in said non-volatile memory means.

7. The sensor characteristic adjustment circuit of claim 5 comprising:

a first additional AND gate having a non-inverting input for receiving a write enable signal, an output of said first AND gate being coupled to said additional memory cell for storing the write suppression bit;

timer means, having an input coupled to said output of said first additional AND gate, for holding a high level output of said additional AND gate for a predetermined length of time; and a second additional AND gate having a non-inverting input coupled to said additional memory cell for storing the write suppression bit and an inverting input coupled to an output of said timer means wherein an output of said second additional AND gate is coupled to inverting input terminals of said main AND gates and said first additional AND gate.

8. The sensor characteristic adjustment circuit as claimed in claim 1 wherein:

said adjustment means is coupled to said data conversion means; and said sensor characteristic adjustment circuit comprises:

first gate means, inserted between said data conversion means and said adjustment means, for separating said adjustment means from said data conversion means after the parallel data bits supplied from said data conversion means are written into said non-volatile memory means; and second gate means, inserted between said non-volatile memory means and said adjustment means, for separating said adjustment means from said non-volatile memory means before the parallel data bits supplied from said data conversion means are written into said non-volatile memory means.

9. The sensor characteristic adjustment circuit of claim 8 wherein said non-volatile memory means includes first memory cells for storing the first parallel data bits and second memory cells for storing the second parallel data bits.

10. The sensor characteristic adjustment circuit of claim 9 wherein said first digital-to-analog (D/A) converter is coupled to said first memory cells, and said second digital-to-analog converter is coupled to said second memory cells.

11. The sensor characteristic adjustment circuit of claim 10 wherein said amplifier circuit includes an input terminal coupled to said summing circuit and a control input coupled to said second digital-to-analog converter for amplifying an output of said summing circuit by an amplification factor corresponding to an output of said second digital-to-analog converter.

12. The sensor characteristic adjustment circuit of claim 9 comprising:

an additional memory cell for storing a write enable bit wherein said first gate means includes first tri-state buffer gates inserted between said non-volatile memory means and inputs of said adjustments means, said first tri-state buffer gates having non-inverting control terminals coupled to an output of said additional memory cell for storing the write enable bit;

said second gate means includes second tri-state buffer gates inserted between said data conversion means and said inputs of said adjustments means, said second tri-state buffer gates having inverting control terminals coupled to said output of said additional memory cell for storing the write enable bit; and said data conversion means includes selector means for selectively converting the first serial data bits into the first parallel data bits and the second serial data bits into the second parallel data bits.

13. The sensor characteristic adjustment circuit of claim 8 comprising:

an additional memory cell for storing a write enable bit wherein said first gate means includes first tri-state buffer gates inserted between said non-volatile memory means and inputs of said adjustments means, said first tri-state buffer gates having non-inverting control terminals coupled to an output of said additional memory cell for storing the write enable bit; and said second gate means includes second tri-state buffer gates inserted between said data conversion means and said inputs of said adjustments means, said second tri-state buffer gates having inverting control terminals coupled to said output of said additional memory cell for storing the write enable bit.

* * * * *